United States Patent [19]
Casciotti et al.

[11] 4,183,611
[45] Jan. 15, 1980

[54] INLAID CONTACT

[75] Inventors: Albert Casciotti, Hershey; Gary L. Zimmerman, Shermansdale, both of Pa.

[73] Assignee: AMP Incorporated, Harrisburg, Pa.

[21] Appl. No.: 685,856

[22] Filed: May 13, 1976

[51] Int. Cl.² .............................................. H01R 9/06
[52] U.S. Cl. ............................... 339/275 B; 113/119; 29/630 C; 339/278 C
[58] Field of Search .............. 339/275, 278; 29/630 C; 113/119

[56] References Cited
U.S. PATENT DOCUMENTS

| | | | |
|---|---|---|---|
| 1,378,501 | 5/1921 | Wall | 29/630 C |
| 2,961,762 | 11/1960 | Clark et al. | 29/630 C |
| 3,864,004 | 2/1975 | Friend | 339/275 B |
| 3,864,014 | 2/1975 | Lynch | 339/275 R |

OTHER PUBLICATIONS

Electronic Design, 7/1959, p. 118.

Primary Examiner—Joseph H. McGlynn
Attorney, Agent, or Firm—Russell J. Egan

[57] ABSTRACT

An improved electrical contact is disclosed formed from a sheet metal stock base which has been skived and inlaid with at least one strip of metal having different electrical and/or mechanical characteristics from the base metal to thereby form an improved electrical contact. The inlaid strips can include a strip of noble metal to improve the electrical characteristics of the contact at the point of engagement with a mating contact. At least one solder repelling strip can be inlaid so that the resulting contact may be dip or wave soldered without the danger of the solder being wicked into the contact. A further inlaid strip can include a solder material so that the contact can be soldered by a reflow operation.

7 Claims, 6 Drawing Figures

INLAID CONTACT

BACKGROUND OF THE INVENTION

1. The Field of the Invention

The present invention relates to an improved electrical contact having portions thereof plated by inlaid metal to enhance the physical and electrical characteristics thereof and in particular to an electrical contact formed from flat sheet metal stock having portions of inlaid diverse metals therein.

2. The Prior Art

It is well known in the electrical connector industry that the characteristics of an electrical contact can be selectively improved by having at least a portion of the contact formed from a metal of a particular electrical and/or physical characteristic. For example, it has been well known that the electrical and wear characteristics of contacts can be improved by plating the formed contact with a gold or a gold alloy. However, because of the increased price of gold, plating is not always an acceptable method of achieving this result since the plating bath deposits the gold on areas of the contact which never require the additional gold and it will be of no use. Further, there are many expenses associated with chemical processing of electrical contacts, including hidden expenses of environmental control of waste baths, that may be too expensive for some contacts.

It is also known to place solder on various portions of contacts so that they can be subjected to a solder reflow operation after having been mounted in a printed circuit board or the like. This is taught, for example, in U.S. Pat. Nos. 3,780,433; 3,905,665; and 3,915,546.

It is further known that the flow of solder on a contact can be controlled by appropriately defined areas of solder resist material, such as aluminum, stainless steel or glass, see U.S. Pat. Nos. 3,686,625; 3,786,172; and 3,887,760, respectively.

SUMMARY OF THE INVENTION

An improved electrical contact is formed from flat sheet metal stock having at least one inlaid strip of metal exhibiting a different electrical and/or mechanical characteristic from the base metal stock. The inlaid metal can be in a plurality of parallel strips and include such divergent metals as: noble metals, to improve electrical characteristics of portions of the contact; aluminum, stainless steel and other metals non-wettable by solder, to prevent wicking of solder into enclosed portions of the contact; and solder for reflow soldering of the contact to an associated substrate.

It is therefore an object of the present invention to produce an improved electrical contact which has particular metals inlaid in the contact only at those points where it is desirable to improve and/or modify the electrical and/or mechanical characteristics of the contact.

It is a further object of the present invention to produce an electrical contact from flat sheet metal stock having strips of diverse metals inlaid therein to prevent wicking of solder into the formed contact during a subsequent soldering operation.

It is a further object of the present invention to produce an electrical contact from inlaid material thereby obviating all chemical processing during the manufacture of the contact.

It is a further object of the present invention to produce an electrical contact having at least one area inlaid with a noble metal, at least one area inlaid with a metal resistant to the flow of solder and at least one area of solder material.

It is a further object of the present invention to teach a method of producing an electrical contact by forming sheet metal stock of a base material and inlaying at least one strip of divergent metal material in said base material whereby the electrical and/or mechanical characteristics of the resulting contact are enhanced and/or improved.

A further object of the present invention is to produce an electrical contact which can be readily and economically manufactured.

The means for accomplishing the foregoing objects and other advantages will be made apparent to those skilled in the art from the following detailed description taken with reference to the accompanying drawings.

DETAILED DESCRIPTION OF THE PRESENT INVENTION

The present invention is shown as it would be used to manufacture an electrical receptacle contact of the type known as AMPMODU, a product of AMP Incorporated of Harrisburg, Pa., and shown in U.S. Pat. Nos. 3,269,805; Re 26,646; 3,270,251; Re 26,837; and 3,363,224.

Figure 1:
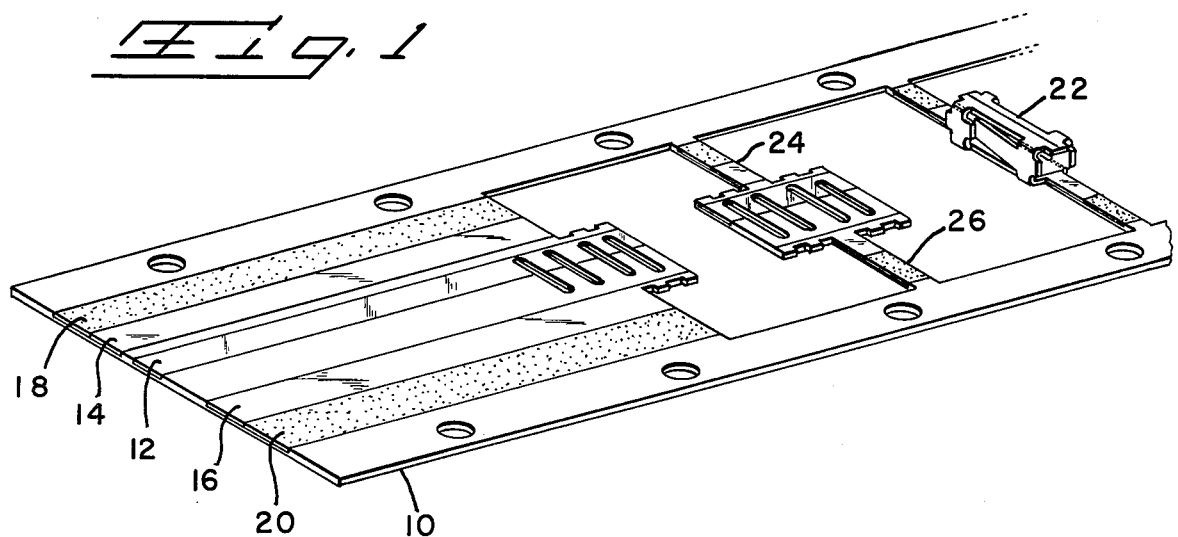
FIG. 1 is a perspective view of a strip of contact forming material.

The base strip 10 is a conventional strip of thin metal material such as copper, bronze, or another suitable highly conductive metal alloy used in electrical contacts. The base strip of metal is skived out by appropriate apparatus, not shown, and strips of metal are inlaid in the channels left by the skiving operation. In the FIG. 1, a strip of a nickel gold alloy 12 is flanked by strips 14, 16 of a solder resistant material, such as aluminum or stainless steel, which are in turn flanked by strips 18, 20 of a solder material.

It will be noted that the contact, when it is formed, will have the nobel metal 12 on the interior surfaces of a socket portion 22 of the contact while the solder resistant material 14, 16 will be at each end of the socket portion and the solder 18, 20 will be on the outer end portions of the mounting tabs 24, 26, respectively.

Figure 2:
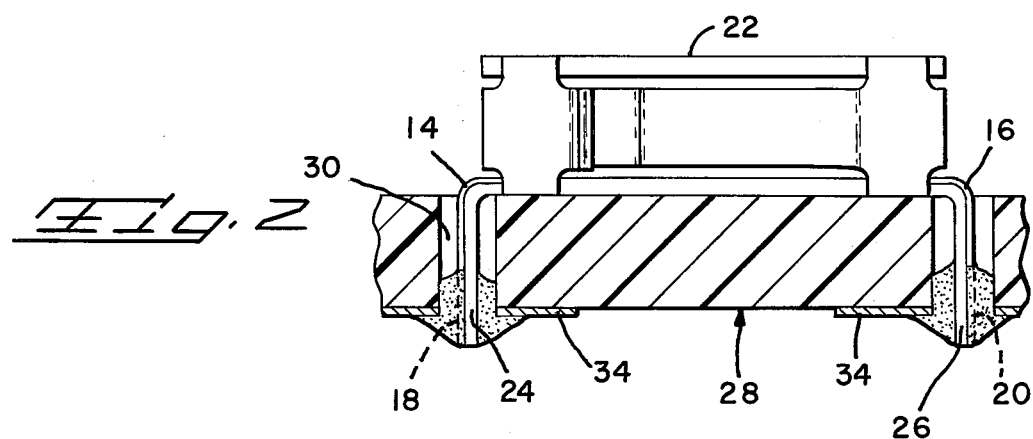
FIG. 2 is a side elevation, partially in section, of a contact according to the present invention mounted horizontally on a printed circuit board.
Figure 3:
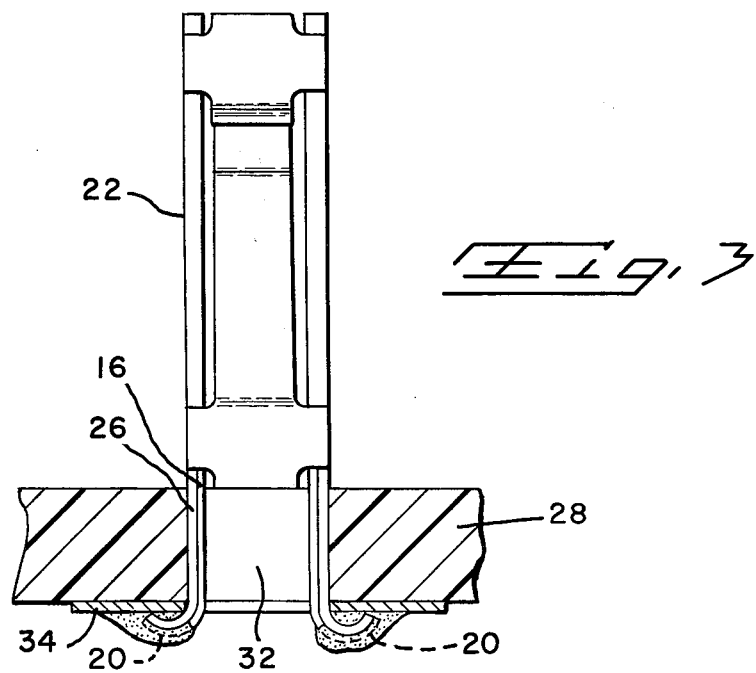
FIG. 3 is a side elevation, partially in section, of a contact according to the present invention mounted vertically on a printed circuit board.

The contact would be mounted in a printed circuit board in a manner shown in FIGS. 2 and 3 with the mounting tabs 24, 26 extending through the holes 30, 32 in the printed circuit board 28. The solder 18, 20 is shown after reflowing to make contact with the preformed circuitry 34 on the printed circuit board 28. The solder resistant inlay 14, 16 will prevent the wicking of the solder material up through the apertures 30, 32 to fill into the receptacle portion 22 of the contact by capillary action.

Figure 4:
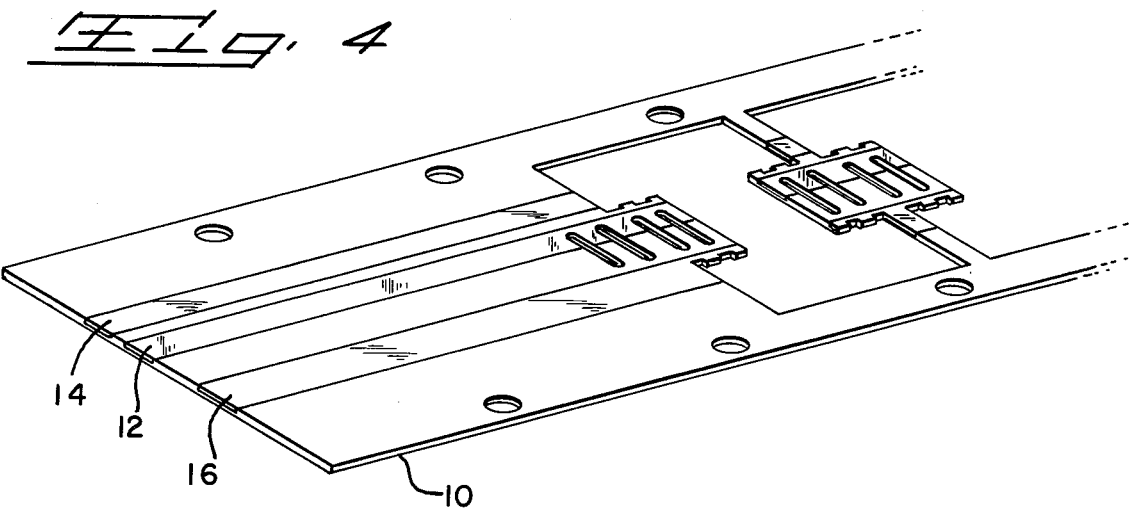
FIG. 4 is a perspective view, similar to FIG. 1, showing an alternate embodiment of the metal strip according to the present invention.
Figure 5:
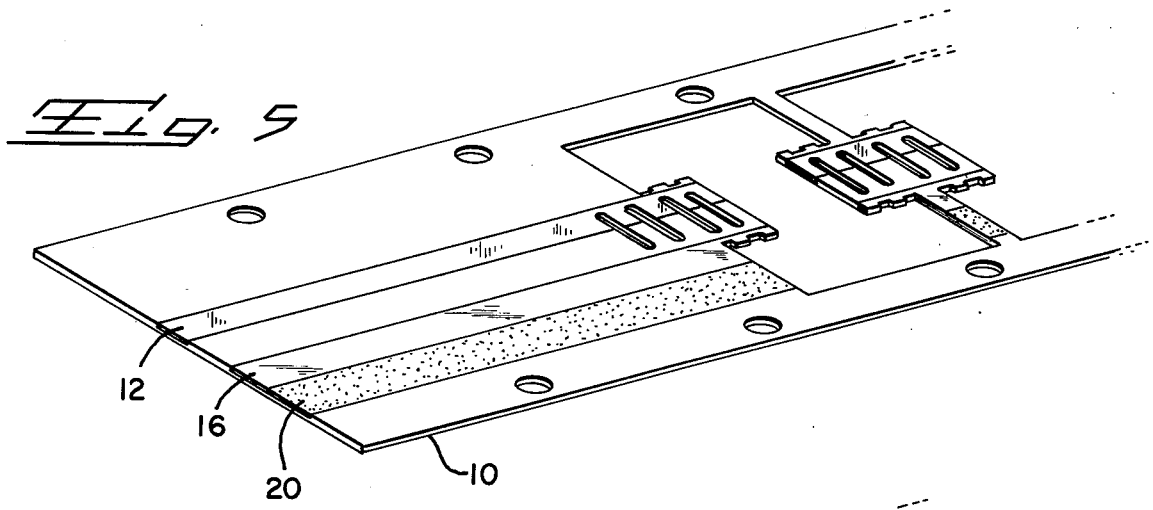
FIG. 5 is a perspective view, similar to FIGS. 1 and 4, showing another alternate embodiment of the metal strip according to the present invention.
Figure 6:
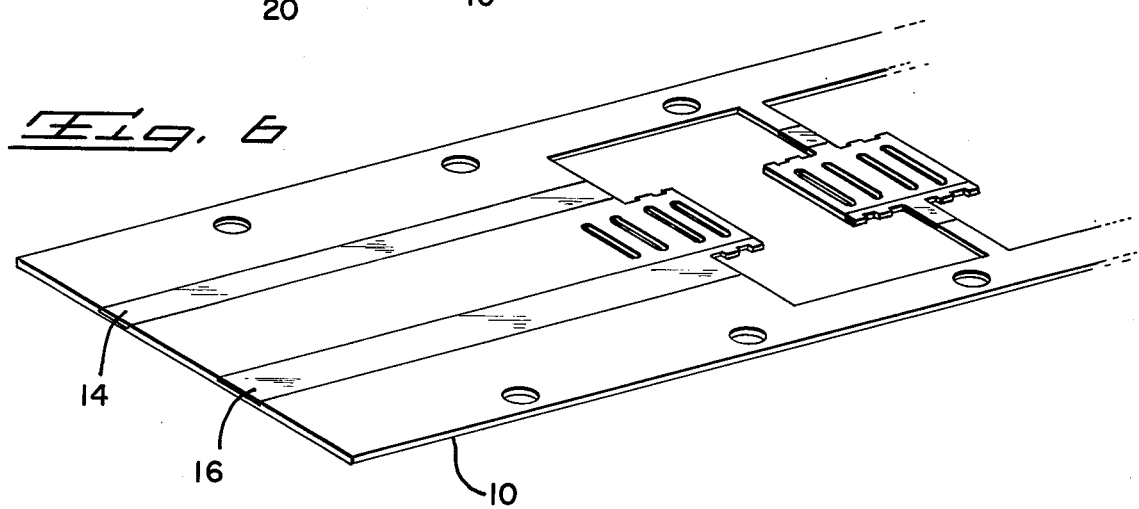
FIG. 6 is a perspective view, similar to FIGS. 1, 4, and 5, showing a further alternate embodiment of the metal strip according to the present invention.

Other embodiments of the present invention are shown in FIGS. 4 to 6 with various combinations of the noble metal, solder resistant metal, and solder combined therewith.

The present invention may be subject to many changes and modifications without departing from the spirit or essential characteristics thereof. The present embodiments are therefore to be considered in all respects as illustrative and not restrictive of the scope of the invention.

What is claimed is:

1. An improved electrical contact terminal which is stamped and formed from a strip of thin metal stock inlaid with at least one strip of metal of special electrical and/or mechanical characteristics, said contact terminal having a primary contact area and at least one mounting tab, comprising:
    a base strip of a first metal material;
    at least first and second parallel channels skived in said base strip;
    a strip of second metal, selected from the group of noble materials, inlaid into each said at least one first channel;
    a strip of third metal, selected from the group of solder resistant materials, inlaid into each said second channel;
    said contact being stamped and formed from said base strip and inlaid strips with said second metal material lying at said area of primary contact and said third material lying between said mounting tabs and said second metal material whereby wicking of solder onto said noble metal is prevented.

2. An improved electrical contact terminal according to claim 1 wherein said group of solder resistant materials includes stainless steel and aluminum.

3. An improved electrical contact terminal according to claim 1 further comprising:
    at least one third channel skived in said base strip parallel to and between said second channel and said mounting tab;
    at least one strip of solder material inlaid into said third channel whereby said contact is mounted by a solder reflow operation.

4. An improved electrical contact terminal according to claim 1 wherein a second channel is skived in said base strip on each side of said at least one first channel.

5. A method of manufacturing improved electrical contact terminals having primary contact areas and at least one mounting tab comprising the steps of:
    forming a base strip of a first metal material;
    skiving at least first and second parallel channels in said base material;
    inlaying a first metal strip, selected from the group of noble metals, into each said first channel;
    inlaying a second metal strip, selected from the group of solder resistant materials, into each said second channel; and
    stamping and forming an electrical contact terminal from said base strip and inlaid strips with said first inlaid material being positioned at the primary contact areas and said second inlaid material interposed between the mounting tabs and said noble metal.

6. A method of manufacturing improved electrical terminals according to claim 5 further comprising the steps of:
    skiving a third channel in said base material parallel to and between said second channel and said mounting tabs, and
    inlaying a strip of solder material into second third channel whereby said terminal is mounted by a solder reflow operation.

7. A method of manufacturing improved electrical terminals according to claim 5 further comprising the steps of:
    skiving a second channel in said base material parallel to and on each side of said first channel, and
    inlaying a strip of second material in each said second channel.

* * * * *